(12) United States Patent
Walter

(10) Patent No.: US 9,941,692 B2
(45) Date of Patent: Apr. 10, 2018

(54) OVERVOLTAGE PROTECTION FOR A MULTIVOLTAGE VEHICLE ELECTRICAL SYSTEM

(71) Applicant: Robert Bosch GmbH, Stuttgart (DE)

(72) Inventor: Gerhard Walter, Gerlingen (DE)

(73) Assignees: ROBERT BOSCH GMBH, Stuttgart (DE); SEG AUTOMOTIVE GERMANY GMBH, Stuttgart (DE)

( * ) Notice: Subject to any disclaimer, the term of this patent is extended or adjusted under 35 U.S.C. 154(b) by 253 days.

(21) Appl. No.: 14/909,000

(22) PCT Filed: Jun. 27, 2014

(86) PCT No.: PCT/EP2014/063656
§ 371 (c)(1),
(2) Date: Jan. 29, 2016

(87) PCT Pub. No.: WO2015/014551
PCT Pub. Date: Feb. 5, 2015

(65) Prior Publication Data
US 2016/0156179 A1 Jun. 2, 2016

(30) Foreign Application Priority Data
Jul. 30, 2013 (DE) .................. 10 2013 214 835

(51) Int. Cl.
*H02H 7/06* (2006.01)
*H02H 7/08* (2006.01)
(Continued)

(52) U.S. Cl.
CPC .......... *H02H 9/045* (2013.01); *B60L 3/0069* (2013.01); *B60L 3/12* (2013.01); *B60L 11/02* (2013.01);
(Continued)

(58) Field of Classification Search
CPC .......... H02H 9/045; H02H 3/36; H02H 5/105; H02H 3/202; H02H 9/04; H02H 3/20;
(Continued)

(56) References Cited

U.S. PATENT DOCUMENTS 4,686,442 A * 8/1987 Radomski ............. H02J 7/1423
320/123
2004/0130214 A1 7/2004 Murty et al.
(Continued)

FOREIGN PATENT DOCUMENTS

CN 202749807 U 2/2013
DE 199 44 833 3/2001
(Continued)

*Primary Examiner* — Ronald W Leja
*Assistant Examiner* — Nicolas Bellido
(74) *Attorney, Agent, or Firm* — Norton Rose Fulbright US LLP; Gerard Messina

(57) ABSTRACT

An overvoltage protection circuit for a first subsystem of a multivoltage vehicle electrical system, in which the first subsystem having a first vehicle electrical system voltage, a second subsystem having a second vehicle electrical system voltage, and an electric machine for supplying the second subsystem. The first system voltage is less than the second system voltage. The overvoltage protection circuit includes a first ground connection for connecting a shared ground potential of the first subsystem, the second subsystem, and the electric machine, an additional second ground connection for connecting a reference ground potential, and a control connection for controlling the electric machine. The overvoltage protection circuit checks whether a ground differential voltage between the first and second ground connections reaches a threshold value, and for reducing the second vehicle electrical system voltage when the ground differential voltage between the first and second ground connections reaches the threshold value.

15 Claims, 3 Drawing Sheets

(51) Int. Cl.
*H02K 11/00* (2016.01)
*B60L 3/00* (2006.01)
*H02H 9/04* (2006.01)
*H02H 3/20* (2006.01)
*H02H 5/10* (2006.01)
*H02H 3/36* (2006.01)
*B60L 3/12* (2006.01)
*B60L 11/02* (2006.01)
*B60L 11/14* (2006.01)
*B60L 11/18* (2006.01)
*G01R 31/02* (2006.01)
*B60R 16/03* (2006.01)
*G01R 31/00* (2006.01)

(52) U.S. Cl.
CPC ........... *B60L 11/14* (2013.01); *B60L 11/1868* (2013.01); *B60R 16/03* (2013.01); *G01R 31/026* (2013.01); *H02H 3/202* (2013.01); *H02H 3/36* (2013.01); *H02H 5/105* (2013.01); *H02H 9/04* (2013.01); *B60L 2240/427* (2013.01); *G01R 31/006* (2013.01); *Y02T 10/642* (2013.01); *Y02T 10/70* (2013.01); *Y02T 10/7005* (2013.01); *Y02T 10/7066* (2013.01); *Y02T 10/7077* (2013.01)

(58) Field of Classification Search
CPC .. H02H 5/10; H02H 3/16; H02H 3/08; H02H 9/041; H02H 9/026; B60R 16/03; B60R 16/023; B60R 16/0232; G01R 31/026; G01R 31/006; G01R 19/14; G01R 31/02; B60L 11/1868; B60L 11/14; B60L 11/02; B60L 3/12; B60L 3/0069; B60L 2240/427; B60L 1/00; B60L 3/04; B60L 11/1887; B60L 11/123; B60L 11/1803; B60L 3/0061; Y02T 10/7066; Y02T 10/7005; Y02T 10/642; Y02T 10/7077; Y02T 10/70; Y02T 10/6286; Y02 90/34; H02J 7/1423; H02J 2001/008; G06N 99/005; Y10T 307/625; F02N 11/006; B60W 20/00; B60W 50/023; B60W 50/029; B60W 10/26; B60W 10/08; B60W 10/06; B60W 2050/0027; B60W 20/50; H01J 61/56; H01J 61/82

See application file for complete search history.

(56) References Cited

U.S. PATENT DOCUMENTS

| | | | |
|---|---|---|---|
| 2009/0015973 | A1 | 1/2009 | Trunk et al. |
| 2011/0037317 | A1* | 2/2011 | Kuschnarew ....... B60L 11/1887 307/9.1 |
| 2012/0303189 | A1* | 11/2012 | Namuduri ............ B60W 20/00 701/22 |
| 2013/0335865 | A1* | 12/2013 | Kim ........................ H02H 3/16 361/42 |
| 2014/0334044 | A1* | 11/2014 | Horihata .................. H02H 7/06 361/20 |
| 2014/0350781 | A1* | 11/2014 | Mehringer .......... B60R 16/0232 701/34.4 |

FOREIGN PATENT DOCUMENTS

| | | |
|---|---|---|
| DE | 19961435 A1 | 6/2001 |
| DE | 100 02 537 | 7/2001 |
| DE | 102 47 282 | 7/2003 |
| DE | 102 011 079 326 | 1/2013 |
| EP | 1 363 378 | 11/2003 |
| EP | 1 422 803 | 5/2004 |
| JP | H03239129 A | 10/1991 |
| JP | 2002010694 A | 1/2002 |
| JP | 2002369590 A | 12/2002 |
| JP | 2004203091 A | 7/2004 |
| JP | 2007511408 A | 5/2007 |
| JP | 2007195007 A | 8/2007 |
| JP | 2014220955 A | 11/2014 |
| WO | WO 201 305 0207 | 4/2013 |

* cited by examiner

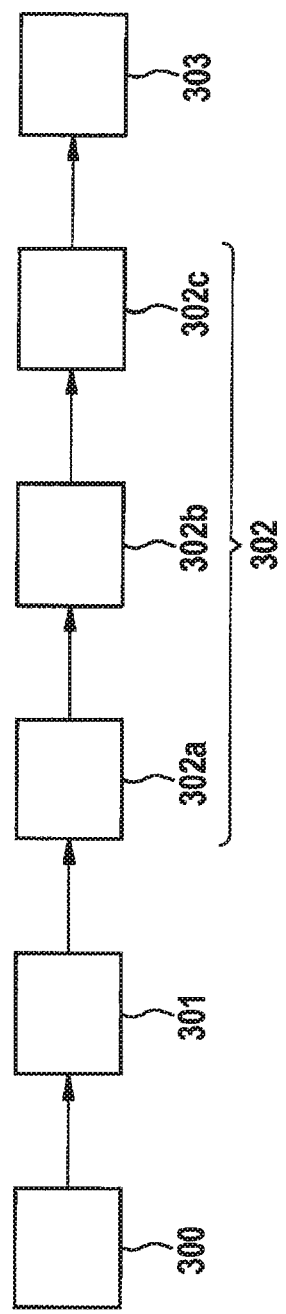

OVERVOLTAGE PROTECTION FOR A MULTIVOLTAGE VEHICLE ELECTRICAL SYSTEM

FIELD OF THE INVENTION

The present invention relates to an overvoltage protection circuit for a subsystem of a multivoltage vehicle electrical system, a multivoltage vehicle electrical system including such an overvoltage protection circuit, and a method for overvoltage protection.

BACKGROUND INFORMATION

Vehicle electrical systems in the form of multivoltage vehicle electrical systems are becoming increasingly important in motor vehicles. Vehicle electrical systems may include an electrical generator (generally an alternating current generator, although the use of direct current generators is also known) which provides the voltage(s) for the vehicle electrical system by converting mechanical kinetic energy into electrical energy.

Due to ever-increasing demand for electrical energy (due to need-based electrification of previously uncontrolled, mechanically or hydraulically operated consumers) and the intention to convert what may be a large quantity of kinetic energy into electrical energy during deceleration phases of a motor vehicle, an enhanced vehicle electrical system voltage (of 48 V in particular) is becoming established. With such a vehicle electrical system voltage, which is approximately four times higher than conventional, lower vehicle electrical system voltages (12 V), on the one hand currents which are four times lower, and on the other hand power which is four times higher, in comparison to conventional vehicle electrical system voltages may be achieved. An upper limit of the vehicle electrical system voltage is imposed by a maximum permissible voltage of 60 V in the vehicle electrical system, which represents the limit for touch voltages which are hazardous to humans, above which (in the event of exceedance) additional complex, costly measures become necessary (for example, warning signs, orange cables, double insulation, insulation monitoring, etc.).

Since numerous consumers are present in motor vehicles, which on the one hand are not easily and cost-effectively convertible to a higher vehicle electrical system voltage, and on the other hand cannot derive a technical/monetary benefit from the higher vehicle electrical system voltage (for example, the radio, dashboard, power windows, etc.), the vehicle electrical system may be configured as a multivoltage vehicle electrical system, in particular as a dual voltage vehicle electrical system including a low-voltage vehicle electrical system having a first, lower vehicle electrical system voltage (in particular 12 V or 24 V), and a high-voltage vehicle electrical system having a second, higher vehicle electrical system voltage (48 V).

In these types of multivoltage vehicle electrical systems, there is the risk of undesirable crosstalk from the high-voltage vehicle electrical system into the low-voltage vehicle electrical system, which could cause destruction of all low-voltage components (which generally have a maximum electric strength of 34 V/500 ms).

One option for preventing crosstalk is to provide galvanically separated ground lines of the 48-V vehicle electrical system (CL41) and of the 12-V vehicle electrical system (CL31) in order to reliably exclude possible coupling or further destruction in the event of ground interruptions. A galvanic separation may take place capacitively (specialized ISO components, for example), optically (optical couplers, for example), or inductively (HF transformers, for example). In the automotive field, all these methods share the common feature that they are complex and costly (due, among other factors, to high demands on the service life and the temperature range, as well as manufacture in small quantities).

The space requirements and the increase in complexity are likewise not insignificant. On the other hand, the above-mentioned galvanic separators generally provide electric strengths well above the required 60 V (generally up to 1,000 V or 1,200 V), since they are used nowadays primarily for 230 VAC (power grid) or 400 V to 600 VAC (hybrid). They are thus greatly oversized and correspondingly expensive.

In addition to the disadvantages due to the effort for galvanic separation, as the result of implementing the requirement for separate ground lines for a generator application (high-voltage generator, for example the boost recuperation system (BRS)), unlike the related art for automotive generators, it would no longer be allowable or possible to use the engine ground (via the fastening screws) as ground, which instead would have to be insulated, with corresponding effort, from the engine block. This is disadvantageous in particular with regard to costs and robustness. In addition, a dedicated ground connecting bolt would have to be provided on the generator, which in addition to the extra costs and installation space problems, in principle involves the risk of polarity reversals. In addition, this dedicated ground connecting bolt would have to be separately connected to the chassis ground, which would require an appropriately current-resistant (and therefore thick and costly) ground strap. The length of the ground strap to be expected would in turn make EMC measures, for example common mode filters, necessary. At the high power levels (high currents) which make the provision of a 48 V vehicle electrical system necessary or meaningful in the first place (in the BRS, for example 250 A to 300 A), relevant voltage drops result at the common mode filter (power losses) which reduce the efficiency gain (loss of performance).

It is therefore desirable to be able to obtain the engine block as a shared ground connection, the electric machine for supplying the high-voltage vehicle electrical system being fastened to ground on the engine block, which likewise defines the ground potential for the low-voltage vehicle electrical system. In the case of a so-called ground interruption (disconnection of the ground connection between the engine block and chassis, which defines a reference ground potential), without further measures an overvoltage results in the low-voltage vehicle electrical system.

It is therefore desirable to provide an option for preventing objectionable crosstalk from a high-voltage vehicle electrical system into a low-voltage vehicle electrical system of a multivoltage vehicle electrical system.

SUMMARY OF THE INVENTION

According to the present invention, an overvoltage protection circuit, a multivoltage vehicle electrical system which includes such an overvoltage protection circuit, and a method for overvoltage protection having the features of the independent patent claims are provided. Advantageous embodiments are the subject matter of the subclaims and the following description.

The multivoltage vehicle electrical system includes a first subsystem having a first vehicle electrical system voltage, a second subsystem having a second vehicle electrical system voltage, and an electric machine for supplying the second subsystem, the first vehicle electrical system voltage being less than the second vehicle electrical system voltage.

The first subsystem, the second subsystem, and the electric machine are connected to a shared first ground connection which is at a shared ground potential. This first ground connection is implemented in particular as an engine block or engine ground. The electric machine is galvanically connected to the engine block in particular via mechanical screw connections. A very low-impedance, reliable, and cost-effective ground connection is thus achieved. An overvoltage protection circuit according to the present invention includes a second ground connection for connecting a reference ground potential, in particular of the chassis ground. According to the present invention, the overvoltage protection circuit checks whether a ground differential voltage between the first ground connection and the second ground connection reaches a threshold value. In the case of a ground interruption (disconnection of the ground strap, for example) between the shared ground potential and the reference ground potential, the ground differential voltage increases. The threshold value is therefore selected in particular as a maximum allowable upper limiting value for the ground differential voltage. When the ground differential voltage reaches the threshold value, overvoltage protection measures are carried out in order to limit the ground differential voltage and thus the first vehicle electrical system voltage.

Due to the overvoltage protection circuit according to the present invention, an excessively high ground differential voltage, in particular due to a line disconnection between the standard ground potential and the reference ground potential, is recognized early. The components of the first subsystem are thus protected from overvoltage by the corresponding overvoltage protection measures. Crosstalk from the second subsystem (high-voltage vehicle electrical system) into the first subsystem (low-voltage vehicle electrical system) and an associated destruction of components of the subsystems is prevented. This is achieved in a particularly advantageous and simple manner also for the case that the ground lines of the high-voltage system and of the low-voltage system are not galvanically separated at the engine block, so that only one ground strap between the engine block and the chassis is still sufficient. The above-described disadvantages associated with a galvanic separation of the grounds and the two ground straps are avoided.

Continuous monitoring of the standard ground potential is carried out with the aid of the present invention. In the event of a fault (occurrence of an overvoltage), on the one hand the electric machine itself is protected from destructive overvoltages (or also undervoltages), and on the other hand it is ensured that electrical consumers (such as glow plugs and their control devices) directly connected to the shared first ground connection, as well as the first subsystem, which is indirectly connected via the directly connected electrical consumers, are not damaged.

The overvoltage protection measures may include active and/or passive measures. Passive measures may be implemented in particular by specialized components of the overvoltage protection circuit. Active measures may be control measures, for example. In particular, the overvoltage protection measures (as described in greater detail below) are implemented in three different stages, which are implemented via advantageous embodiments of the overvoltage protection circuit according to the present invention.

In particular, a ground line to a point on the chassis of the motor vehicle is implemented with the aid of the additional second ground connection. The second ground connection may be situated in a signal connector into which communication lines, in particular in the form of a CAN bus system, are also plugged in. The present invention may therefore also be implemented in existing multivoltage vehicle electrical systems without special cabling effort, since communication lines usually include ground lines anyway, for example for protection.

The overvoltage protection circuit advantageously includes a passive protective element which is connected between the first and the second ground connections. This passive protective element may in particular include Zener diodes, in particular two Zener diodes in a bipolar Zener structure, and/or metal oxide semiconductor field effect transistors (MOSFETs), in particular two MOSFETs connected in series. The passive protective element is in particular part of the passive measures of the overvoltage protection measure, and forms a first stage of the overvoltage protection measure. Due to the passive protective element, an excessive voltage increase is already prevented before active measures take effect. A bipolar configuration of two Zener diodes allows limitation of the voltage in question in a particularly easy manner.

The passive protective element takes over the overvoltage protection or the overvoltage protection measures immediately after the overvoltage occurs, in particular until active measures may be initiated. This includes in particular a time interval between 10 µs and 100 µs after the ground interruption or after the overvoltage occurs. After this time interval, the ground interruption is detected, and active measures, in particular control measures, are initiated. This takes place in particular in a second stage of the overvoltage protection measures.

The MOSFETs are advantageously controlled with the aid of a protective circuit made up of temperature-decoupled and temperature-stabilized Zener diodes and diode chains. A small tolerance of the Zener diodes and of a threshold voltage of the MOSFETs, as well as a stabilized temperature dependency, are thus ensured. Alternatively or additionally, a protective circuit made up of a separate voltage control may be implemented with a low outlay of hardware. Initial tolerances and temperature dependencies of the MOSFETs are thus balanced via the separate voltage control.

The passive protective element may also be formed, for example, as a series connection of at least one Zener diode with at least one semiconductor diode, by a transient voltage suppression (TVS) diode, by at least one field effect transistor (FET) which is controlled with the aid of a Zener diode, or by at least one varistor.

The overvoltage protection circuit may include a comparator which is connected to the first ground connection and to the second ground connection on the input side. The comparator determines the ground differential voltage between the first ground connection and the second ground connection, and compares the ground differential voltage to the threshold value. The comparator recognizes a rapid (high-energy) voltage jump between the two ground connections. If the ground differential voltage exceeds the threshold value, the comparator alerts in particular a microcontroller or a control unit. In the process, the comparator in particular emits a digital signal. The comparator triggers a digital interrupt at the microcontroller or control unit. The microcontroller or the control unit then carries out multiple advantageous measurements in order to check the plausibility of the ground interruption. The microcontroller or the control unit thus detects the ground interruption and initiates the active measures of the overvoltage protection measure. This detection of the ground interruption and the initiation of the active measures represents in particular the second stage of the overvoltage protection measure.

If the overvoltage protection circuit does not include a comparator, the microcontroller or the control unit may also be alerted or triggered with the aid of an analog signal. The ground differential voltage of the overvoltage protection circuit is queried at regular intervals (1 ms, for example) via an analog input to the microcontroller or the control unit. In order to not respond to a single pulse here, at least three or more values of the ground differential voltage should be queried. A very slow response time is thus associated until the microcontroller or the control unit is able to initiate overvoltage protection measures or until the overvoltage is detected. In the meantime, the passive protective element forms the overvoltage protection measure, and heats up by a specified temperature. This principle is suitable in particular for a slow, "creeping" disconnection of the shared ground connection.

If the voltages of the first ground connection and of the second ground connection drift apart only slowly, a "hard" disconnection of the first ground connection is not present; instead, a "creeping," wear-related first ground connection is present. This may be case, for example, due to corrosion of a screw or of the engine ground, for example. This case may be recognized, for example, via slow, cyclical AD measurements (in predrive, for example). In this case, the overvoltage protection measure is likewise carried out. If a characteristic voltage offset, which indicates this type of wear-related disconnection of the first ground connection in particular due to corrosion, is recognized, operation prior to running up the system may be prevented with an appropriate magnitude of the offset.

As an overvoltage protection measure or as active measures, electrical consumers in the second subsystem may be switched on for reducing the voltage. Alternatively or additionally, the operation of the electric machine is advantageously alternated between motor mode and generator mode as an overvoltage protection measure. Alternatively or additionally, a (rolling) phase short circuit of phase connections of the electric machine may be carried out. "Rolling" means that the phase to be short-circuited is cycled through. Control to a defined (small) ground offset until the remaining energy is withdrawn from the system and the system is passivated without current is thus made possible.

The alternation of the electric machine between operation in motor mode and operation in generator mode is carried out in particular by a phase angle shift. In this way, electrical energy may be consumed in motor mode, and is thus withdrawn from the vehicle electrical system. The phase angle corresponds to a phase shift between the phase voltage and the synchronous generated internal voltage of the electric machine. The phase voltage is a voltage which is applied to a stator winding of a stator of the electric machine. The synchronous generated internal voltage corresponds to a voltage which is induced by an excitation current through a rotor winding of a rotor in the stator winding. In the generator mode of the electric machine, the phase angle takes on positive values, and in the motor mode of the electric machine, takes on negative values. The phase angle is adjusted by specifying the phase voltage (via the power converter between the stator and the vehicle electrical system).

At a certain phase angle, which is a function of the design, the electric machine is operated in neither generator mode nor in motor mode. The electrical power consumed by the electric machine is consumed as a power loss in the electric machine, or additionally, in the power output stage. Thus, even over a fairly long time interval, the electric machine may be utilized as an electrical consumer in order to consume the electrical energy introduced into the vehicle electrical system by overvoltage, and to thus reduce the first vehicle electrical system voltage.

On the other hand, the phase angle may be continuously adjusted, the electric machine being continuously transferred from generator mode to motor mode (and vice versa). In the process, continuous current delivery or current consumption takes place. The generator current may thus be set to the maximum allowable voltage value of the first vehicle electrical system. This operation may take place in a controlled or regulated manner (at ground offset voltage, for example). The electric machine may consume excess electrical energy in the vehicle electrical system by generating a torque.

In one advantageous embodiment of the present invention, a connection between the second subsystem and the electric machine is separated as an overvoltage protective measure or as active measures. This represents the third stage of the overvoltage protection measure. The second subsystem is thus switched off and connected without power. A possible hazard due to an overvoltage of the components of the first and second subsystems is no longer present. An energy supply from the second subsystem (for example, a high-voltage battery of the second subsystem and/or an energy transfer of a DC/DC converter) is in particular reduced to zero.

Energy flow from the electric machine into the second subsystem is interrupted, for example, by opening the main contactors of an energy store of the second subsystem and/or by limiting the energy transfer of the DC/DC converter from the first subsystem. In addition, electrical consumers are switched on (for a time period of approximately 20 ms to 50 ms), when possible, in order to reduce the energy in the first subsystem.

This third stage of the overvoltage protection measure is likewise initiated by the microcontroller or the control unit, in particular via the communication network or the CAN bus system. This third stage of the overvoltage protection measure is configured for a fairly long time interval, since the CAN bus system usually has response times of around 10 ms, and mechanical relays (with trigger times between 10 ms and 100 ms) are frequently installed in batteries. Fatigue strength against overvoltages is thus ensured, since the passive protective element would possibly be overloaded over such a long time interval.

In addition, an error entry may be made in a control unit of the energy store of the second subsystem, or of the high-voltage battery, or of the other components of the second subsystem (for example, the DC/DC converter, electrical steering). This makes diagnostic capability possible.

A warning or a warning signal to components of the second subsystem may be output, in particular via the CAN bus system, before the overvoltage protection measure is carried out. The warning is output in particular at all control units for energy sources (the energy store, DC/DC converter, electrical steering, for example) which are present in the second subsystem. In particular, interruption of an energy flow into the second subsystem (for example, due to opening the main contactors of the energy store or limiting the energy transfer of the DC/DC converter), and/or switching on electrical consumers of the second subsystem for voltage reduction, is output as a warning.

A processing unit according to the present invention, for example a control unit of a motor vehicle, is configured, in particular by programming, for carrying out a method according to the present invention.

In addition, implementing the method in the form of software is advantageous, since this involves particularly low costs, in particular when an executing control unit is also utilized for other tasks and is therefore present anyway. Suitable data carriers for providing the computer program are in particular flash memories, EEPROMs, and others. Downloading a program via computer networks (Internet, intranet, etc.) is also possible.

Further advantages and embodiments of the present invention result from the description and the appended drawings.

It is understood that the features mentioned above and to be explained below may be used not only in the particular stated combination, but also in other combinations or alone without departing from the scope of the present invention.

The present invention is schematically illustrated in the drawings, based on exemplary embodiments, and is described in greater detail below with reference to the drawings.

The figures are described below in at least a partially interrelated manner. Identical components are denoted by the same reference numerals in the various figures.

BRIEF DESCRIPTION OF THE DRAWINGS

FIG. 3 shows one specific embodiment of a method according to the present invention as a block diagram.

DETAILED DESCRIPTION

Figure 1:
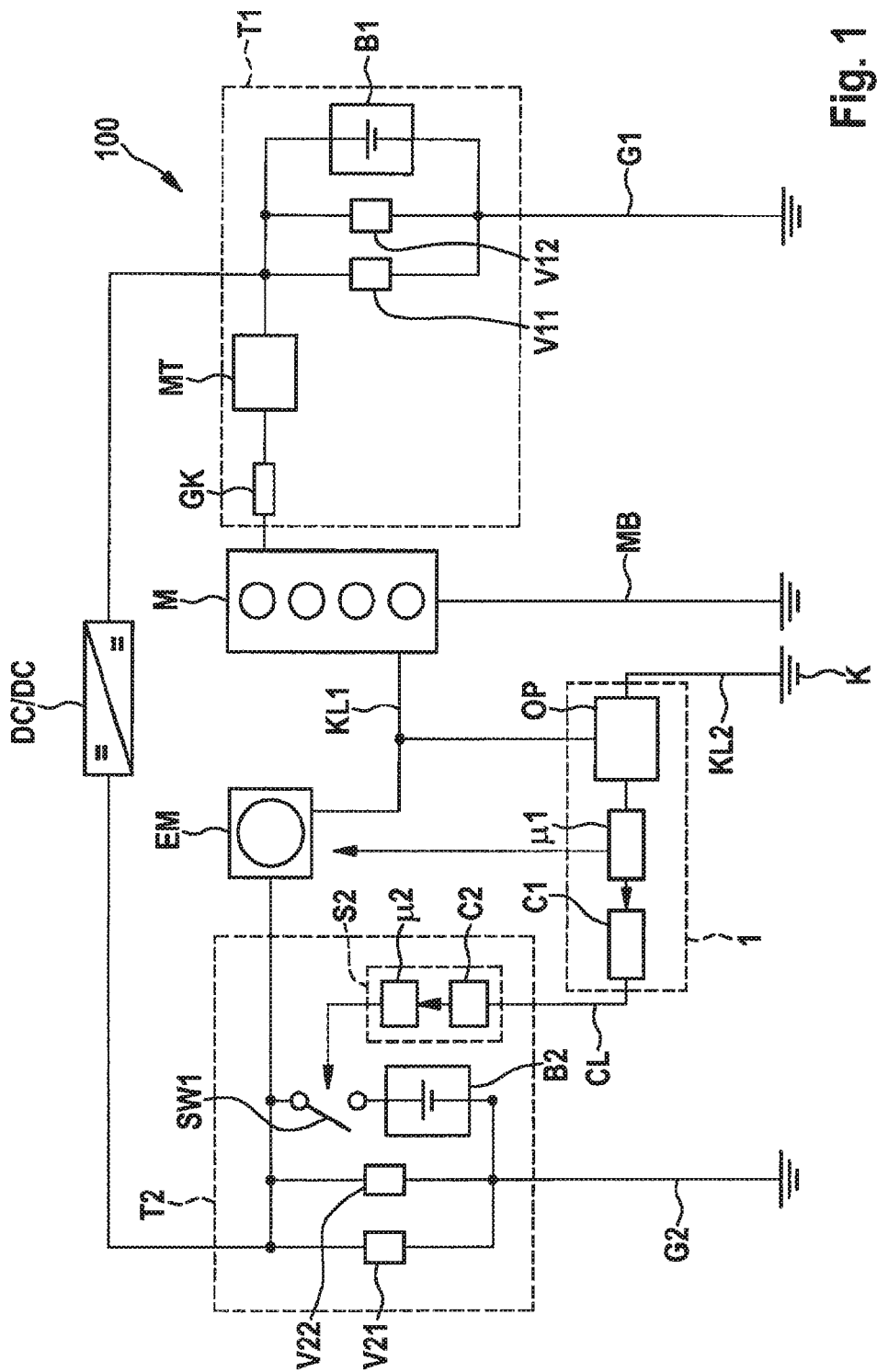
FIG. 1 shows a dual voltage vehicle electrical system which includes an overvoltage protection circuit according to the present invention according to one specific embodiment of the present invention, in a schematic illustration.

A multivoltage vehicle electrical system in the form of a dual voltage vehicle electrical system according to one specific embodiment of the present invention is schematically illustrated in FIG. 1 and denoted overall by reference numeral 100. Dual voltage vehicle electrical system 100 includes a first subsystem T1 and a second subsystem T2. First subsystem T1 has a lower first vehicle electrical system voltage of in particular 12 V or 24 V, and second subsystem T2 has a higher second vehicle electrical system voltage of in particular 48 V.

First subsystem T1 includes a first energy store B1, for example a lithium-ion battery, a capacitive store, or a conventional vehicle battery. First energy store B1 provides, for example, the first vehicle electrical system voltage of +12 V. A first electrical consumer V11 and a second electrical consumer V12, symbolized by a simplified equivalent circuit diagram, are situated in first subsystem T1.

First subsystem T1 also includes a control unit in the form of an engine control unit MT. Engine control unit MT controls, for example, glow plugs GK of an internal combustion engine M.

An electric machine EM for supplying second subsystem T2 is connected to internal combustion engine M; the electric machine is configured as a claw-pole generator, for example, and may be operated in generator mode and in motor mode. Electric machine EM is connected in an electrically conductive manner via its housing to an engine block, denoted in FIG. 1 by reference character KL1, of internal combustion engine M. The engine block of internal combustion engine M is used as a ground for electric machine EM, and thus, at the same time also for second subsystem T2. Typically, the screw connection of the glow plugs to the engine block at the same time forms the ground connection, so that a shared ground connection is thereby formed.

Electric machine EM is connected to second subsystem T2. First subsystem T1 is coupled to second subsystem T2 via a direct voltage converter DC/DC.

Electrical consumers V11 and V12 as well as engine control unit MT and glow plugs GK represent components (low-voltage components) of first subsystem T1, and have a maximum electric strength of 34 V/500 ms, for example.

Second subsystem T2 likewise includes an energy store B2, which is connected to second subsystem T2 via a switch SW1, and electrical consumers V21 and V22, which represent components (high-voltage components) of second subsystem T2. Energy store B2 may have the same design as energy store B1 explained above, and delivers the second vehicle electrical system voltage of +48 V.

Energy store B1 of first subsystem T1 is connected to a ground connection G1. Energy store B2 of second subsystem T2 is connected to a ground connection G2. Ground connections G1 and G2 are ground connections on a reference potential, in the present case a chassis potential, for example.

The engine block of internal combustion engine M, which represents a shared ground connection for first subsystem T1, electric machine EM, and second subsystem T2, is used as a further reference ground for the dual voltage vehicle electrical system. The engine block is connected to the reference ground via a ground strap MB.

A disconnection of ground strap MB results in the two ground potentials drifting apart, and thus, in an overvoltage in first subsystem T1. If this type of ground interruption occurs, a fault current flows, as the result of which the polarity of glow plugs GK and engine control unit MT situated in first subsystem T1 is reversed, and they are acted on by a corresponding reverse polarity voltage or overvoltage. The overvoltage usually has a voltage value which generally exceeds the maximum electric strength of engine control unit MT and destroys it. This may result in the overvoltage breaking through into second subsystem T2 and destroying low-voltage components V11 and V12.

To protect components MT, V11, and V12 of first subsystem T1 from overvoltage and to prevent destruction of components MT, V11, and V12 of first subsystem T1, dual voltage vehicle electrical system 100 also includes one specific embodiment of an overvoltage protection circuit 1 according to the present invention.

Overvoltage protection circuit 1 is connected to electric machine EM or to ground connection KL1 of electric machine EM on the input side. Overvoltage protection circuit 1 includes an additional second ground connection KL2 (a signal ground line, for example). This second ground connection KL2 is connected to the reference ground potential. A comparator circuit OP of overvoltage protection circuit 1 is checked for whether a ground differential voltage between first ground connection KL1 and second ground connection KL2 reaches a threshold value.

Comparator circuit OP is connected to a first microcontroller µ1. Microcontroller µ1 is programmed for carrying out a method according to the present invention, and for this purpose may control in particular electric machine EM and/or may output control instructions via a first CAN transceiver C1, which is connected to a communication line CL or to a CAN bus.

Overvoltage protection circuit 1 may communicate with a control unit S2 in second subsystem T2 via CAN bus CL. In addition, various consumers V21, V22 are connected to communication line CL.

Control unit S2 likewise includes a CAN transceiver C2 and a microcontroller $\mu$2. Second control unit S2 is, for example, a control unit of second energy store B2 (battery management system (BMS)) or a control unit of second subsystem T2.

CAN transceivers C1 and C2 do not necessarily have to be separate components, and instead may be configured in particular as part of the particular microcontroller $\mu$1 or $\mu$2.

Lastly, overvoltage protection circuit 1 is connected to second subsystem T2 on the output side, and is thus in operative connection with microcontroller $\mu$2.

Figure 2:
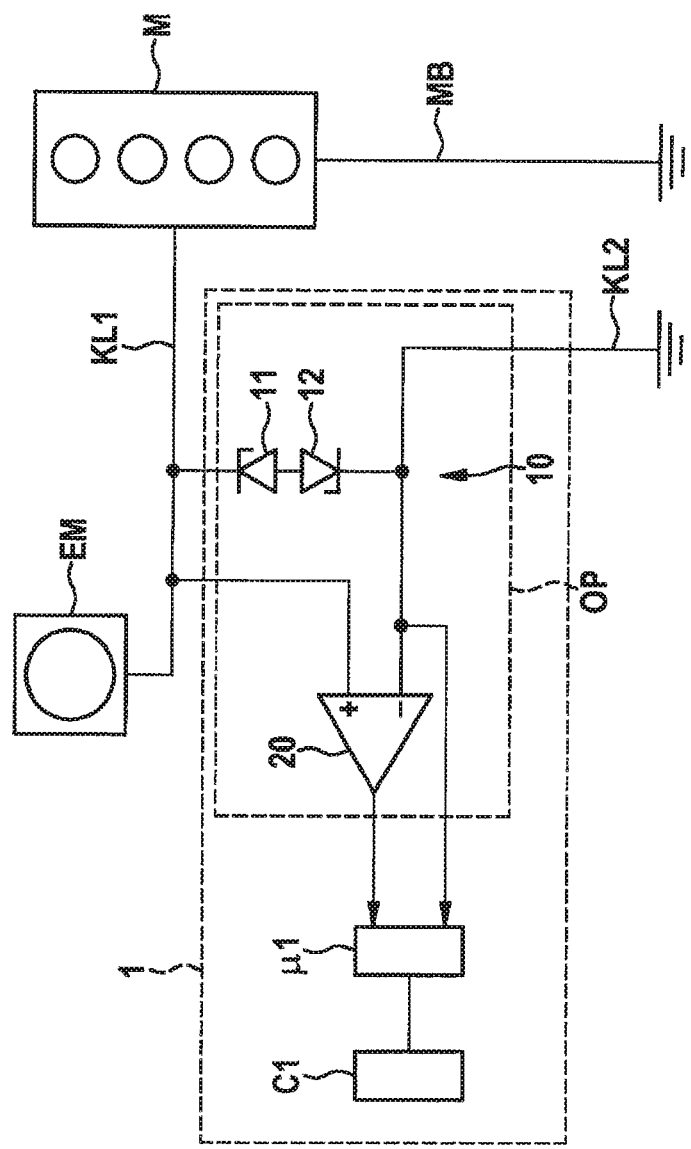
FIG. 2 shows one specific embodiment of an overvoltage protection circuit according to the present invention in a schematic illustration.

One specific embodiment of overvoltage protection circuit 1 is schematically illustrated in FIG. 2. Dual voltage vehicle electrical system 100 is also configured for carrying out one specific embodiment of a method according to the present invention for overvoltage protection. This is schematically illustrated as a block diagram in FIG. 3.

The design and mode of functioning of overvoltage protection circuit 1 according to the present invention and the sequence of the method according to the present invention are explained below in an interrelated manner with reference to FIGS. 2 and 3.

In order to check whether the ground differential voltage reaches the threshold value, overvoltage protection circuit 1 includes comparator circuit OP, which includes a comparator component 20 (for example, an operational amplifier). On the input side, the comparator component is connected via KL1 to the reference ground potential of the engine block, and via KL2 to the reference ground potential of the chassis, and compares the ground differential voltage to the threshold value. As long as ground strap MB establishes a galvanic connection between engine block M and the chassis, the two ground potentials are essentially equal, and the ground differential voltage is thus essentially zero. However, if the galvanic connection is impaired or damaged, the ground differential voltage increases.

When the ground differential voltage reaches a predefined threshold value, this may be detected by microcontroller $\mu$1, which then recognizes a fault event and initiates overvoltage protection measures. However, since this (active) detection may require a time interval of up to 100 $\mu$s after the overvoltage occurs, overvoltage protection circuit 1 additionally includes a passive protective element 10 which, as a first stage of the overvoltage protection measure, takes over the overvoltage protection of dual voltage vehicle electrical system 100 within this time interval.

In FIG. 3, the stated fault event in the form of a disconnection of ground strap MB (ground interruption) occurs in a step 300. This first stage of the overvoltage protection measure is implemented by passive protective element 10 of overvoltage protection circuit 1 in step 301. Passive protective element 10 includes two Zener diodes 11 and 12, which are situated in a bipolar Zener structure and connected between first ground connection KL1 and second ground connection KL2. Passive protective element 10 takes over a passive overvoltage protection measure until active overvoltage protection measures are initiated. Passive protective element 10 limits the ground differential voltage.

Comparator component 20, as explained above, determines in step 302a that the ground differential voltage reaches the threshold value. This is detected by microcontroller $\mu$1, which subsequently advantageously carries out multiple measurements to check the plausibility of the ground interruption. If the measurements likewise show that an overvoltage is present, the fault event is thus detected. Overvoltage protection circuit 1 or microcontroller $\mu$1 now initiates active overvoltage protection measures.

A first active overvoltage protection measure involves, in step 302b, a reduction of the voltage generated by electric machine EM. For this purpose, electric machine EM is controlled by overvoltage protection circuit 1 in such a way that the vehicle electrical system voltage in second subsystem T2, and thus, crosstalk from second subsystem T2 into first subsystem T1, is reduced. Overvoltage protection circuit 1 in particular carries out a phase angle shift of electric machine EM, as the result of which the power generated by the electric machine (generator mode) is continuously reduced, and may be adjusted all the way to power consumption (motor mode). Alternatively or additionally, the voltage generated by electric machine EM may be reduced by reducing an excitation field, in particular by way of a fast de-excitation. With both measures, an attempt is made to hold the ground differential voltage below the threshold value, for example to a certain value or to zero.

Overvoltage protection circuit 1 may also send a digital signal in step 302c, via CAN transceiver C1 and communication line CL, which instructs all consumers V21, V22 which are reachable in second subsystem T2 via communication line CL to supply (preferably) no energy to the second vehicle electrical system and/or to withdraw (preferably) a large amount of energy from second vehicle electrical system T2. The second aspect also includes in particular switching on consumers.

Initiating and carrying out the active measures (step 302b and 302c) forms a second stage (302) of the overvoltage protection measure.

Second subsystem T2 is deactivated or switched off and connected without power in step 303 as the third stage of the overvoltage protection measure. For this purpose, control unit S2 receives an appropriate instruction from overvoltage protection circuit 1, and then actuates and opens switch SW1.

What is claimed is:

1. An overvoltage protection circuit for a first subsystem of a multivoltage vehicle electrical system, comprising:
an overvoltage protection circuit arrangement configured to check whether a ground differential voltage between a first ground connection and a second ground connection reaches a threshold value, and for reducing a second vehicle electrical system voltage when the ground differential voltage between the first ground connection and the second ground connection reaches the threshold value;
wherein the vehicle electrical system includes the first subsystem having a first vehicle electrical system voltage, a second subsystem having the second vehicle electrical system voltage, and an electric machine for supplying the second subsystem, the first vehicle electrical system voltage being less than the second vehicle electrical system voltage, and includes a first ground connection for connecting a shared ground potential of the first subsystem, the second subsystem, and the electric machine, and an additional second ground connection for connecting a reference ground potential, and a control connection for controlling the electric machine.

2. The overvoltage protection circuit of claim 1, wherein the overvoltage protection circuit includes a passive overvoltage protective element which is connected between the first ground connection and the second ground connection.

3. The overvoltage protection circuit of claim 1, wherein the overvoltage protection circuit includes a comparator which is connected to the first ground connection and to the second ground connection on the input side.

4. The overvoltage protection circuit of claim 1, wherein the overvoltage protection circuit is configured for reducing the voltage generated by the electric machine when the ground differential voltage between the first ground connection and the second ground connection reaches the threshold value.

5. The overvoltage protection circuit of claim 1, wherein the overvoltage protection circuit is configured for separating a connection between the second subsystem and the electric machine when the ground differential voltage between the first ground connection and the second ground connection reaches the threshold value.

6. The overvoltage protection circuit of claim 1, further comprising:
 a communication connection which is connectable to a communication line to output control instructions to at least one component for one or both of the first and second subsystem(s).

7. The overvoltage protection circuit of claim 6, wherein the second ground connection is an integral part of the communication connection.

8. A multivoltage vehicle electrical system, comprising:
 a first subsystem having a first vehicle electrical system voltage;
 a second subsystem having a second vehicle electrical system voltage;
 an electric machine for supplying the second subsystem, wherein the first vehicle electrical system voltage is less than the second vehicle electrical system voltage; and
 an overvoltage protection circuit configured to check whether a ground differential voltage between a first ground connection and a second ground connection reaches a threshold value, and for reducing the second vehicle electrical system voltage when the ground differential voltage between the first ground connection and the second ground connection reaches the threshold value;
 wherein the vehicle electrical system includes the first ground connection for connecting a shared ground potential of the first subsystem, the second subsystem, and the electric machine, and an additional second ground connection for connecting a reference ground potential, and a control connection for controlling the electric machine, and
 wherein the first ground connection of the overvoltage protection circuit is connected to a shared ground potential of the first subsystem, the second subsystem, and the electric machine, and the second ground connection is connected to a reference ground potential.

9. A method for protecting a first subsystem of a multivoltage vehicle electrical system from an overvoltage, the method comprising:
 reducing the second vehicle electrical system voltage when a ground differential voltage between a shared ground potential of the first subsystem, a second subsystem, and an electric machine and a reference ground potential reaches a threshold value;
 wherein the vehicle electrical system includes the first subsystem having a first vehicle electrical system voltage, the second subsystem having a second vehicle electrical system voltage, and the electric machine for supplying the second subsystem, the first vehicle electrical system voltage being less than the second vehicle electrical system voltage.

10. The method of claim 9, wherein the voltage generated by the electric machine is reduced when the ground differential voltage reaches the threshold value.

11. The method of claim 10, wherein at least one of the following is performed: (i) operation of the electric machine is alternated between a motor mode and a generator mode, and (ii) a rolling, phase short circuit of the electric machine is carried out when the ground differential voltage reaches the threshold value.

12. The method of claim 9, wherein a connection between the second subsystem and the electric machine is separated when the ground differential voltage reaches the threshold value.

13. The method of claim 9, wherein electrical consumers are used in the second subsystem for reducing the voltage.

14. A non-transitory computer readable medium having computer-executable components, which is executable by a processor, comprising:
 a program code arrangement having program code for protecting a first subsystem of a multivoltage vehicle electrical system from an overvoltage, by performing the following:
 reducing the second vehicle electrical system voltage when a ground differential voltage between a shared ground potential of the first subsystem, a second subsystem, and an electric machine and a reference ground potential reaches a threshold value;
 wherein the vehicle electrical system includes the first subsystem having a first vehicle electrical system voltage, the second subsystem having a second vehicle electrical system voltage, and the electric machine for supplying the second subsystem, the first vehicle electrical system voltage being less than the second vehicle electrical system voltage.

15. The non-transitory computer readable medium having computer-executable components of claim 14, wherein the overvoltage protection circuit includes a passive overvoltage protective element which is connected between the first ground connection and the second ground connection.

\* \* \* \* \*